(12) United States Patent
Kapoor et al.

(10) Patent No.: US 10,223,197 B2
(45) Date of Patent: Mar. 5, 2019

(54) INTEGRATED CIRCUIT DEVICE AND METHOD FOR APPLYING ERROR CORRECTION TO SRAM MEMORY

(71) Applicant: NXP B.V., Eindhoven (NL)

(72) Inventors: Ajay Kapoor, Eindhoven (NL); Nur Engin, Eindhvoen (NL); Steven Thoen, Leuven (BE); Jose Pineda de Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/820,436

(22) Filed: Aug. 6, 2015

(65) Prior Publication Data

US 2017/0039104 A1     Feb. 9, 2017

(51) Int. Cl.
*G06F 11/10*     (2006.01)
*G11C 29/52*     (2006.01)
*H03M 13/35*     (2006.01)

(52) U.S. Cl.
CPC ...... *G06F 11/1068* (2013.01); *G06F 11/1048* (2013.01); *G11C 29/52* (2013.01); *H03M 13/353* (2013.01)

(58) Field of Classification Search
CPC ... G06F 11/1068; G11C 29/52; H03M 13/353
See application file for complete search history.

(56) References Cited

U.S. PATENT DOCUMENTS

| | | | |
|---|---|---|---|
| 5,058,116 A | 10/1991 | Chao et al. | |
| 5,355,342 A * | 10/1994 | Ueoka | G11C 29/28 365/201 |
| 5,428,956 A | 7/1995 | Maus et al. | |
| 6,278,633 B1 | 8/2001 | Wong et al. | |
| 7,043,679 B1 | 5/2006 | Keltcher et al. | |
| 7,093,156 B1 * | 8/2006 | Shubat | G11C 29/4401 365/200 |
| 7,203,873 B1 * | 4/2007 | Adams | G11C 29/1201 714/31 |
| 7,237,175 B2 * | 6/2007 | Hatakenaka | G06F 11/1012 714/763 |
| 8,347,176 B2 | 1/2013 | Resnick et al. | |
| 8,898,548 B1 * | 11/2014 | Mullendore | G06F 11/1048 365/185.09 |
| 9,424,952 B1 | 8/2016 | Seok et al. | |

(Continued)

FOREIGN PATENT DOCUMENTS

WO     2009032945 A1     3/2009
WO     2012/039983 A1     3/2012

OTHER PUBLICATIONS

Alessandro Paccagnella, "Single Event Effects: SRAM", Scuola Nazionale di Legnaro, 2007.

(Continued)

*Primary Examiner* — April Y Blair
*Assistant Examiner* — Rong Tang (57) ABSTRACT

In accordance with an embodiment of the invention, an integrated circuit (IC) device is disclosed. In the embodiment, the IC device includes an SRAM module, wrapper logic coupled to the SRAM module, a context source, and an ECC profile controller coupled to the context source and to the wrapper logic, the ECC profile controller configured to select an ECC profile in response to context information received from the context source for use by the wrapper logic.

18 Claims, 8 Drawing Sheets

(56) References Cited

U.S. PATENT DOCUMENTS

| | | | |
|---|---|---|---|
| 9,703,632 | B2 | 7/2017 | Thoen |
| 9,778,983 | B2 | 10/2017 | Engin et al. |
| 2004/0017711 | A1 | 1/2004 | Kang et al. |
| 2004/0083334 | A1* | 4/2004 | Chang ............... G06F 11/1008 711/103 |
| 2005/0044467 | A1 | 2/2005 | Leung et al. |
| 2005/0251728 | A1* | 11/2005 | Stocken ............... G11C 29/42 714/763 |
| 2006/0008255 | A1 | 1/2006 | Yen et al. |
| 2007/0283193 | A1* | 12/2007 | Lewis ............... G06F 11/1064 714/48 |
| 2008/0133994 | A1 | 6/2008 | Oh |
| 2009/0043951 | A1 | 2/2009 | Shalvi et al. |
| 2009/0094504 | A1 | 4/2009 | Sadakata et al. |
| 2009/0125790 | A1* | 5/2009 | Iyer ............... G06F 11/1068 714/773 |
| 2009/0144598 | A1 | 6/2009 | Yoon et al. |
| 2009/0193301 | A1 | 7/2009 | Ito et al. |
| 2010/0165730 | A1 | 7/2010 | Sommer et al. |
| 2010/0269022 | A1 | 10/2010 | Clark et al. |
| 2011/0032758 | A1 | 2/2011 | Son et al. |
| 2011/0047408 | A1 | 2/2011 | Gille et al. |
| 2011/0302476 | A1 | 12/2011 | Lee et al. |
| 2012/0324314 | A1 | 12/2012 | Seshadri et al. |
| 2013/0179751 | A1 | 7/2013 | Linstadt |
| 2013/0254627 | A1 | 9/2013 | Jeddeloh |
| 2014/0047301 | A1 | 2/2014 | Kurata |
| 2014/0068365 | A1 | 3/2014 | Chen et al. |
| 2014/0164873 | A1 | 6/2014 | Guyot et al. |
| 2014/0281810 | A1 | 9/2014 | Gifford et al. |
| 2015/0100847 | A1 | 4/2015 | Ojalvo et al. |
| 2015/0301887 | A1 | 10/2015 | Zhang et al. |
| 2016/0132391 | A1 | 5/2016 | Thoen |
| 2016/0141037 | A1 | 5/2016 | Kim |
| 2016/0274969 | A1 | 9/2016 | Chen et al. |
| 2016/0274970 | A1 | 9/2016 | Earhart |

OTHER PUBLICATIONS

L.Z. Scheick, G.M. Swift, and S.M. Guertin, "SEU Evaluation of SRAM Memories for Space Applications", IEEE transaction in nuclear science, 2001.
Robert C. Baumann, "Radiation-Induced Soft Errors in Advanced Semiconductor Technologies", IEEE Transactions on Device and Materials Reliability, vol. 5, No. 3, Sep. 2005.
Hajime Kobayashi et al.; "Alpha Particle and Neutron-induced Soft Error Rates and Scaling Trends in SRAM", IEEE 47th annual international reliability physics symposium 2009.
"Memory Scrubbing"; Wikipedia; retrieved from internet Apr. 22, 2015; 7. http://en.wikipedia.org/wiki/Memory_scrubbing.
D.G.Mavis et al.; "Multiple Bit Upsets and Error Mitigation in Ultra Deep Submicron SRAMs", NSREC 2008.
Shubhendu S. et al.; "Cache Scrubbing in Microprocessors: Myth or Necessity?", 10th International Symposium on Pacific Rim Dependable Computing (PRDC), Mar. 3-5, 2004.
"ECC Memory"; Wikipedia; retrieved from the internet Apr. 22, 2015; http://en.wikipedia.org/wiki/ECC_memory.
M. Y. Hsiao, "Class of Optimal Minimum odd-Weight-Column SEC-DED Codes", IBM Journal of Research and Development, vol. 14, No. 4, Jul. 1970, pp. 395-401.
"Low-density parity-check codes based on finite geometries: a rediscovery and new results", Yu Kou, Shu Lin, Fossorier, M.P.C., IEEE Transactions on Information Theory, vol. 47 , Issue: 7, Publication Year: 2001, pp. 2711-2736.
"Near Shannon limit error-correcting coding and decoding: Turbo-codes", C. Berrou, A. Glavieux, P. Thitimajshima, IEEE International Conference on Communications, 1993 , pp. 1064-1070 vol. 2.
Motwani, Ravi et al.; Low Density Parity Check (LDPC) Codes and the Need for Stronger ECC; pp. 1-18; Aug. 2011.
M. H. Abu-Rahma and M. Anis, "Nanometer Variation-Tolerant SRAM", 5 DOI: 10.1007/978-1-4614-1749-1_2, © Springer Science+Business Media New York; 2013.
Gabor Gyepes et al.; "An On-chip Dynamic Supply Current Monitor for Testing of Digital Circuits", 23th Conference Radioelektronika Apr. 16-17, 2013, Pardubice, Czech Republic.
Kai Zhao et al.; "LDPC-in-SSD: Making Advanced Error Correction Codes Work Effectively in Solid State Drives", 11th USENIX Conference on File and Storage Technologies (FAST 13), 2013, https://www.usenix.org/conference/fast13/technical-sessions/presentation/zhao.
European Search Report, 16180733.4, dated Nov. 8, 2016.
European Search Report, 16180734.2, dated Nov. 11, 2016.
Qin, H. "Deep Sub-Micron SRAM Design for Ultra-Low Leakage Standby Operation", Uni. of Cali. Berkeley, Electrical Engineering and Computer Sciences, 88 pgs., retrieved from the internet at: https://pdfs.semanticscholar.org/c6fd/0c8f229ba457c021025af0e4e02f8db0471d.pdf (2007).
Shao, R. Y. et al. "Two Simple Stopping Criteria for Turbo Decoding", IEEE Transactions on Communications, vol. 47, No. 8, pp. 1117-1120 (Aug. 1999).
Li, J. et al. "Early Stopping for LDPC Decoding: Convergence of Mean Magnitude (CMM)", IEEE Communications Letters, vol. 10, No. 9, pp. 667-669 (Sep. 2006).
Gallager, R. G. "Low-Density Parity-Check Codes", Cambridge, Mass., 90 pgs., retrieved from the internet at: https://web.stanford.edu/class/ee388/papers/ldpc.pdf (Jul. 1963).
Extended European Search Report for related Patent Appln. No. 16180731.8 (Mar. 10, 2017).
Office Action for related U.S. Appl. No. 14/820,396 (dated Dec. 13, 2018).

* cited by examiner

INTEGRATED CIRCUIT DEVICE AND METHOD FOR APPLYING ERROR CORRECTION TO SRAM MEMORY

BACKGROUND

Static random access memory (SRAM) utilizes transistors to retain bits of data in a memory array. In order to retain the bits of data, a voltage is applied to the SRAM. Traditionally, the minimum amount of voltage needed to retain bits of data accurately and compensate for SRAM leakage is referred to as the data retention voltage (DRV). In low-power devices, the DRV needed given SRAM leakage can significantly contribute to the total power consumption of the device.

SUMMARY

In accordance with an embodiment of the invention, an integrated circuit (IC) device is disclosed. In the embodiment, the IC device includes an SRAM module, wrapper logic coupled to the SRAM module, a context source, and an ECC profile controller coupled to the context source and to the wrapper logic, the ECC profile controller configured to select an ECC profile in response to context information received from the context source for use by the wrapper logic.

In another embodiment, the context source is configured to detect a process-temperature condition and the ECC profile controller is configured to select an ECC profile in response to the detected process-temperature condition.

In another embodiment, the context source is configured to detect a data retention time and the ECC profile controller is configured to select an ECC profile in response to the detected data retention time.

In another embodiment, the context source is configured to determine latency and throughput requirements and the ECC profile controller is configured to select an ECC profile in response to the determined latency and throughput requirements.

In another embodiment, the context source is configured to determine a level of error sensitivity based on the level of error sensitivity of an application running on the IC device and the ECC profile controller is configured to select an ECC profile in response to the determined level of error sensitivity.

In another embodiment, output of the context source is manually configured by a user.

In another embodiment, the ECC decoder is further coupled to an error map in the SRAM module and the ECC decoder can write back decoding information to the error map.

In another embodiment, the SRAM module is coupled to the wrapper logic such that the SRAM module can selectively bypass the wrapper logic from a dataflow.

In another embodiment, the wrapper logic is coupled to the SRAM module such that the SRAM module can operate independent of the wrapper logic.

In another embodiment, a method for applying error correction to SRAM memory in an IC device is disclosed. In the embodiment, the method involves obtaining context information, selecting an ECC profile based on the context information, scheduling ECC encoding according to the selected ECC profile, and scheduling ECC decoding according to the selected ECC profile.

In another embodiment, the context information includes a process-temperature and the ECC profile is selected based on the process-temperature.

In another embodiment, the context information includes retention time of data within the SRAM module and the ECC profile is selected based on the retention time of data within the SRAM module.

In another embodiment, the context information includes latency and throughput requirements of the application and the ECC profile is selected based on the latency and throughput requirements of the application.

In another embodiment, wherein the context information includes a number of allowed parity bits and an ECC algorithm to use and the ECC profile is selected based on the number of allowed parity bits and the ECC algorithm to use.

In another embodiment, context information includes information regarding the sensitivity of the application to errors and the ECC profile is selected based on the sensitivity of the application to errors.

In another embodiment, the context information is received from a context source within the IC device.

In another embodiment, an IC device is disclosed. In the embodiment, the IC device includes an SRAM module, the SRAM module including at least one transistor, wrapper logic coupled to the SRAM module, the wrapper logic including an error correction code (ECC) encoder coupled to the SRAM module, wherein the ECC encoder is configured to encode input data in accordance with an ECC type given a selected mode of error correction, and output the encoded input data to the SRAM module, an ECC decoder coupled to the SRAM module, wherein the ECC decoder is configured to decode output data received from the SRAM module, output the decoded output data, and write decoding information back to the SRAM module, an error controller coupled to the ECC decoder that is configured to control the ECC decoder in accordance with the ECC type given a selected mode of error correction, and a central controller coupled to the error controller and the ECC encoder, wherein the central controller is configured to control operations between elements of the wrapper and the SRAM module, a context source configured to output context information, and an ECC profile controller coupled between the wrapper logic and the context source, the ECC profile controller configured to select an ECC profile to be used by the ECC encoder and decoder based on the context information from the context source.

In another embodiment, the context source is configured to detect at least one of a process-temperature condition, a data retention time, latency and throughput requirements, and a level of error sensitivity of an application running on the IC device.

In another embodiment, the ECC decoder is further coupled to an error map in the SRAM module and the ECC decoder can write back decoding information to the error map.

In another embodiment, the ECC encoder is further coupled to parity cells in the SRAM module in which the ECC encoder can store error correction codes corresponding to memory words of the input data.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
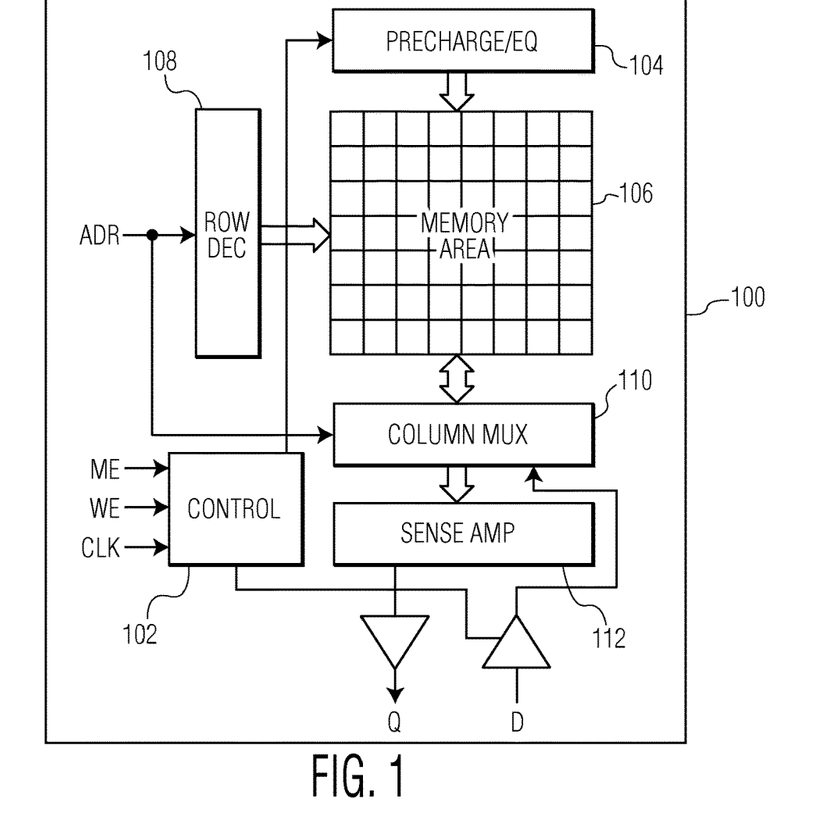
FIG. 1 illustrates a configuration of an SRAM module.

FIG. 1 illustrates a configuration of an SRAM module 100. The SRAM module includes a control circuit 102, a charge source 104 ("PRECHARGE/EQ"), a memory array 106, a row decoder 108, a column multiplexer 110, and a sense amplifier 112. The control circuit is configured to determine if data is being written to or read from the memory array. In an embodiment, the memory array is an array of six transistor SRAM cells. In order to read from or write to the cells in the memory array, the charge source precharges one or more bitlines within each cell. The row decoder is used to select cells to write to and, in conjunction with the column multiplexer, to read stored data from select cells. Unlike DRAM, the data stored in each cell of an SRAM module can be sustained without regularly refreshing the data so long as sufficient power remains available to the memory array. In an embodiment, the minimum sufficient power to sustain data in SRAM is referred to as the data-retention voltage (DRV).

Figure 2:
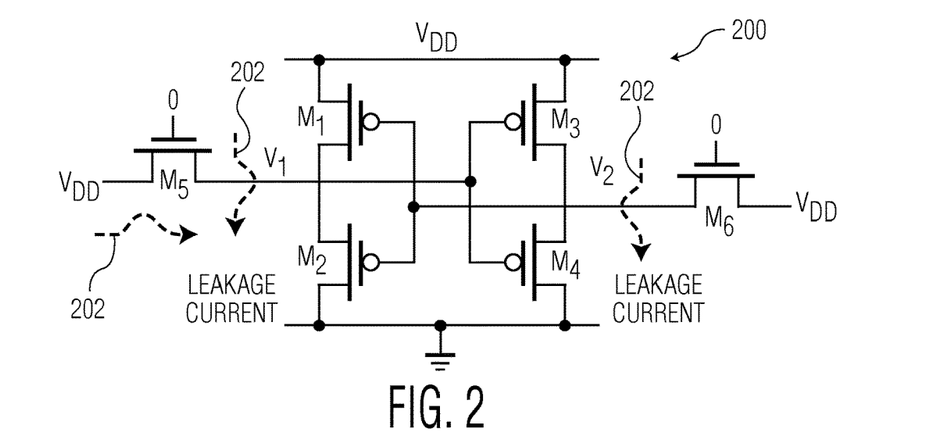
FIG. 2 depicts a circuit diagram of a cell in an SRAM module.

FIG. 2 depicts a circuit diagram of a cell 200 in an SRAM module. Transistors $M_1$-$M_6$ can be opened or closed in the operation of storing charge within the cell. As long as the supply voltage provided to the SRAM module stays above the DRV, the charge stored within the cells of the SRAM module can be reliably sustained. If the supply voltage is decreased below the DRV, charge within the SRAM module may change and the charge stored within the cells of the SRAM module can become unreliable. Thus, the power demand of an SRAM module during data-retention mode is largely determined by the DRV. In an embodiment, the DRV is impacted by leakage (loss of energy from charged capacitors within the transistors), as indicated by the dash line arrows 202, that can create a large power demand and, thus, a high DRV. Voltage lower than the DRV can be applied to the SRAM memory, but doing so increases the chance that the stored charge (and the data represented by the stored charge) becomes unreliable.

Figure 3:
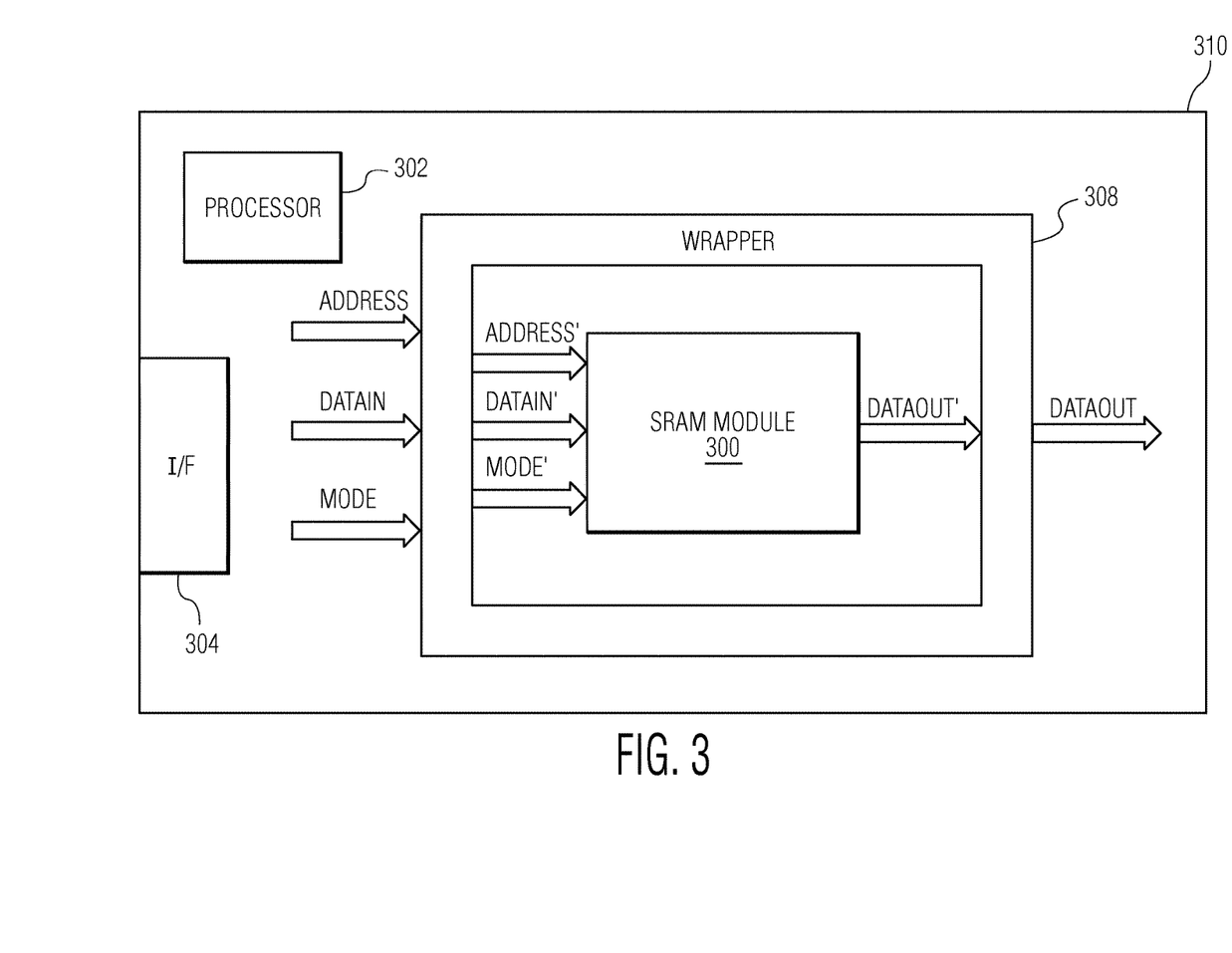
FIG. 3 depicts an IC device that includes a processor, an interface, an SRAM module, and wrapper logic in accordance with an embodiment of the invention.

In order to utilize a supply voltage lower than the DRV, error correction can be applied to data read from an SRAM module. However, "off-the-shelf" SRAM module designs (commonly referred to as "memory IP") are often purchased from a third party and incorporated as is into an IC device. These "off-the-shelf" SRAM module designs do not conventionally include error correction functionality and are not easily modified to support such additional functionality. FIG. 3 depicts an IC device 310 that includes a processor 302, an interface 304, an SRAM module 300, and wrapper logic 308 in accordance with an embodiment of the invention. In an embodiment, the IC device is a microcontroller having an ARM processor and a serial interface, such as an I2C interface, although other interfaces, including a wireless interface, are possible. In an embodiment, the interface has three main inputs (e.g., address, datain, and mode) and is coupled to the processor and the processor is coupled to the SRAM module and to the wrapper logic. In an embodiment, the SRAM module can be configured to include the functionality of the wrapper logic within the SRAM module. In an embodiment, when data is to be stored in the SRAM module, an address, a mode signal (e.g., dynamic mode or standby mode or which type of ECC should be used), and the data (e.g., as a single value or as individual values) are received by the interface, passed to the processor, and then passed to the wrapper logic and/or SRAM module. In an embodiment, multiple SRAM modules can be associated with a single wrapper logic. In response to the mode signal, the system appropriately configures the wrapper logic and/or SRAM module and performs data encoding and passes the data, which may be encoded or un-encoded depending on the mode indicated by the mode signal, to the SRAM module to store at the address. When data needs to be accessed, the SRAM module passes the data from the SRAM module to the wrapper logic and the wrapper logic decodes the data (if needed), performs error correction (if possible), and outputs the data to the interface for further use (e.g., by an application using the SRAM module for data storage) outside of the IC device. In another embodiment, the address, mode signal, and data can originate from within the IC device and pass to the processor, rather than be first received by the interface, and the data can be output to another component within the IC device, rather than to the interface. Thus, by using wrapper logic, error correction can be applied to data in an SRAM module of an "off-the-shelf" memory IP. In an embodiment, the wrapper logic and the SRAM module operate independently of each other. Thus, the wrapper logic can be bypassed from the dataflow (e.g., by opening or closing switches to route signals around the wrapper logic via alternative circuitry) and the SRAM module can be written to or read from without utilizing the wrapper logic. For example, data can be stored and accessed from the SRAM module without powering the wrapper logic.

Figure 4:
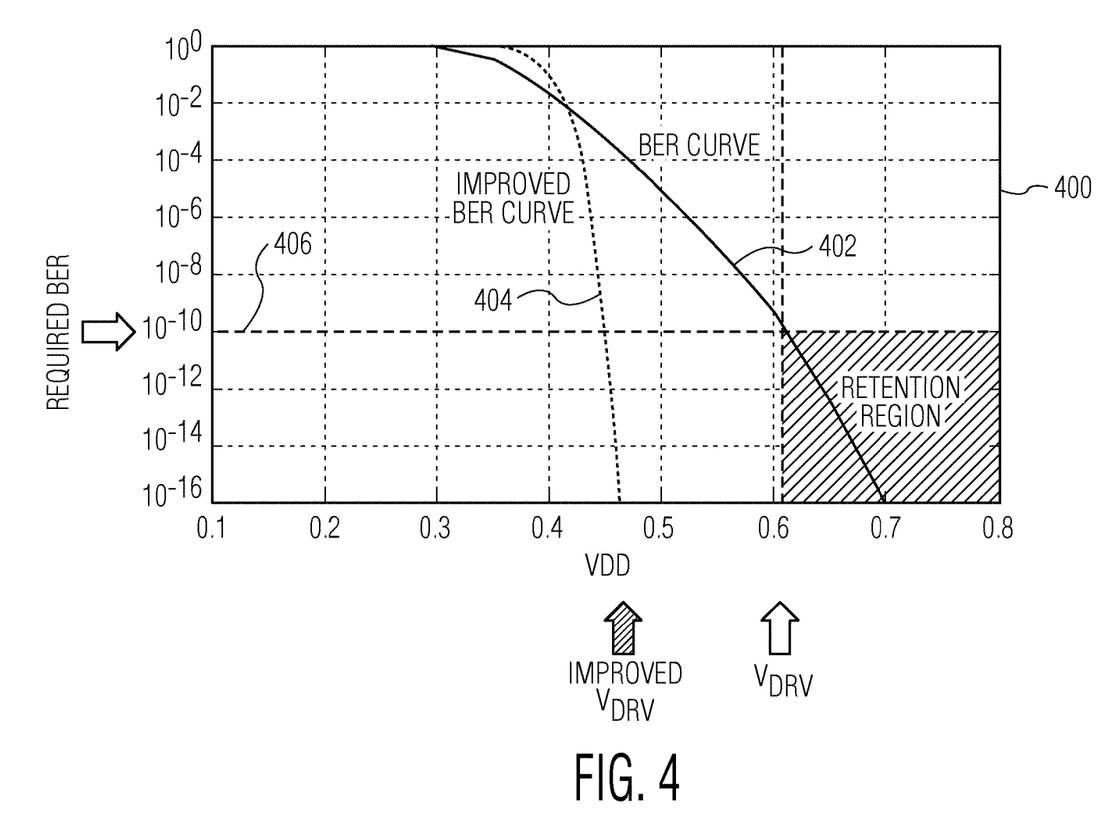
FIG. 4 is a plot of bit error rates (BER) of stored data measured across a range of DRVs.

Applying error correction to data read from an SRAM module allows for a lower DRV to be used, while still maintaining data integrity. FIG. 4 is a plot 400 of bit error rates (BER) of stored data measured across a range of DRVs. The plot indicates a curve when error correction is not used 402, a curve when error correction is used 404, and a threshold BER 306 under which data must stay in order to be reliable. As indicated by the plot, when error correction is not used, the DRV must remain higher, to keep the BER above the threshold, than when error correction is used. Accordingly, by utilizing error correction, the DRV can be reduced and less voltage will need to be applied to the SRAM module to sustain reliable charge in the SRAM cells.

However, using error correction codes typically negatively impacts the performance of read/write requests and the more complex the code is (and, thus, more effective at correcting errors), the greater the impact. For example, various error correction codes have a trade-off between latency (e.g., time required for read/write requests) and the degree of complexity of the code as suggested by Table 1 below:

TABLE 1

| ECC type | Error correction performance | Code block size | Encoder/ Decoder complexity | Encoder/ Decoder Latency |
|---|---|---|---|---|
| Hamming | + | + | + | + |
| Hsaio | + | + | + | + |
| BCH | + | ++ | ++ | ++ |
| Reed solomon | + | ++ | ++ | ++ |
| Convolutional | ++ | ++ | ++ | ++ |
| Turbo | +++ | +++ | +++ | +++ |
| LDPC | ++++ | ++++ | ++++ | ++++ |

*plus signs indicate low (+) to high (++++) degree of magnitude

As per Table 1, the more complex (and thus more effective at correcting errors) an error correction code is, the greater the impact the error correction code has on performance (e.g., read/write requests). Specifically, Table 1 includes an error correction performance column, a code block size column, an encoder/decoder complexity column, and an encoder/decoder latency column. The error correction performance column indicates the ability of the ECC type to correct errors in the code (e.g., better performance allows for more errors to be corrected), the code block size column indicates the size of a code block needed to perform the type of ECC, the encoder/decoder complexity column indicates the complexity of an ECC type (e.g., the complexity of the manipulations performed by the ECC type), and the encoder/decoder latency column indicates the latency caused by the ECC type (e.g., how much of a delay in throughput is introduced as a result of using the ECC type).

Additionally, the mode of error correction can further impact performance. For example, the impact on performance (e.g., throughput or latency) by the modes identified in Table 2 below can vary in degrees.

TABLE 2

| | | System configuration for ECC | | Throughput/ |
|---|---|---|---|---|
| Mode | Functionality | ECC encoder | ECC decoder | Latency |
| 1: Dynamic, No ECC | This mode is used for high throughput operation where no ECC can be afforded (Nominal operating VDD is used during entire operation) | bypass | bypass | +++ |
| 2a: Dynamic, simple ECC, only encode | This mode is used to encode memory data with relatively simpler ECC (e.g. with single error correcting code.). However, during this operation, nominal VDD is used and therefore no need for error decoding and correction is required on the data written to memory. It is also assumed that the earlier written data is either correct or not accessed. Therefore, ECC decoder is bypassed. | SECDED | bypass | ++ |
| 2b: Dynamic, ECC, complex-ECC, only encode | This mode is similar to mode-2a, except that more complex error coding is used in the ECC encoder. | Higher complexity ECC (Table-1) | bypass | ++ |
| 3a: Dynamic, simple ECC, Encode + decode | This mode is used to encode/decode memory data with relatively simpler ECC (e.g. with single error correcting | SECDED | SECDED | + |

TABLE 2-continued

| Mode | Functionality | System configuration for ECC | | Throughput/ Latency |
| --- | --- | --- | --- | --- |
| | | ECC encoder | ECC decoder | |
| 3b: Dynamic, complex ECC, Encode + decode | code.). This mode is similar to mode-3a except more complex ECC is used. Moreover, decoding is made configurable by choosing the decoding parameters (e.g. number of iterations) | Higher complexity ECC(Table-1) | Configurable decoding (Table-1) | TBD based on configuration |
| 4a: Standby, very low VDD | This is a data-retention mode with very low VDD. This will be used either when there is very low probability of data loss (e.g. good Process condition, short data retention time etc.) or low error sensitivity in application (Approximate computation on data) or due to usage of higher complexity ECC | Not active | Not active | 0 |
| 4b: Standby, low VDD | This is a data-retention mode with low VDD. This will be used either when there is lower probability of data loss (e.g. good Process condition, etc.) or due to usage of ECC in memory encode | Not active | Not active | 0 |

*plus signs indicate no (0) throughput/latency to a good (++++) degree of throughput/latency ECC types can be paired with a mode of error correction, as well as other configurations, to form an ECC profile. For example, given Table 1 and Table 2 above, a first ECC profile may pair Hamming-type ECC with mode 2a or a second ECC profile may be configured to not use any ECC type in conjunction with mode 1. In conventional IC devices that utilize ECC in conjunction with SRAM modules, an ECC profile is fixed and used for all data stored in an SRAM module. However, the error sensitivity and throughput needs are not the same for all the data.

In accordance with an embodiment of the invention, an integrated circuit (IC) device is disclosed. In the embodiment, the IC device includes an SRAM module, wrapper logic coupled to the SRAM module, a context source, and an ECC profile controller coupled to the context source and to the wrapper logic. The ECC profile controller is configured to select an ECC profile in response to context information received from the context source for use by the wrapper logic. In an embodiment, the context source outputs context information (e.g., sensor readings or user-defined policies) to the ECC profile controller and the ECC profile controller selects an ECC profile to use based on the context information (e.g., mode 3b using turbo-type ECC). In an embodiment, the context information includes information such as which application is generating a read/write request or how many parity bits can be used and the context information is used to adapt the ECC profile in real-time during the operation of the IC device (e.g., while data is being read/ written). Typically, newer or more complex ECC codes (e.g., turbo or LDPC codes) are not used because the newer or more complex ECC codes negatively impact throughput. However, because the ECC profile can be adapted in real-time based on context information, newer or more complex ECC can be used when best suited for the situation, but do not need to be used for all read/write requests. Thus, a higher average throughput can be maintained when using newer or more complex ECCs in select situations.

Figure 5A:
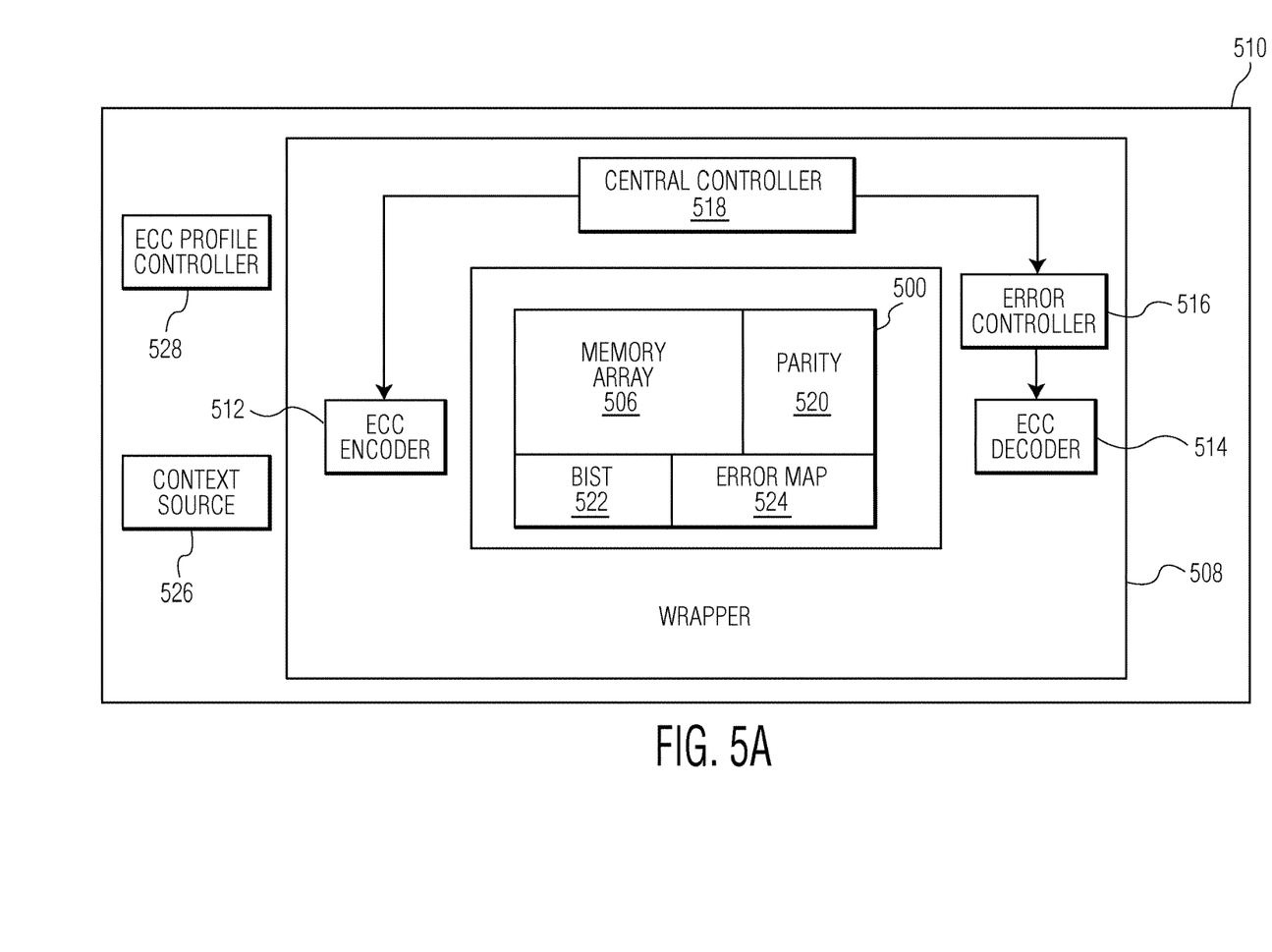
FIG. 5A depicts an embodiment of an IC device that includes an SRAM module, wrapper logic, an ECC profile controller, and a context source.

FIG. 5A depicts an embodiment of an IC device 510 that includes an SRAM module 500, wrapper logic 508, an ECC profile controller 528, and a context source 526. In an embodiment, the IC device further includes an interface and a processor (not shown) and the ECC profile controller and context source can be implement, at least in part, by the processor. In the embodiment of FIG. 5A, the wrapper logic includes an ECC encoder 512, an ECC decoder 514, an error controller 516, and a central controller 518. In an embodiment, the ECC encoder, ECC decoder, error controller, and central controller are implemented by simple standard logic-based design blocks (e.g., arithmetic logic units (ALUs) or a programmable processor) within an execution unit of the IC device. In an embodiment, the SRAM module includes a memory array 506 and can optionally further include parity cells 520, a built-in self-test (BIST) module 522, and an error map 524. In an embodiment, the ECC encoder is coupled to the SRAM module (for example, the memory array), the SRAM module is further connected to the ECC decoder, and the ECC decoder is further coupled to the error controller. The central controller is coupled to and controls the ECC encoder, the error controller, and the SRAM module. The context source is connected to the ECC profile controller and the ECC profile controller is further connected to the central controller. In an embodiment, the ECC profile controller includes components as illustrated in FIG. 6.

Figure 6:
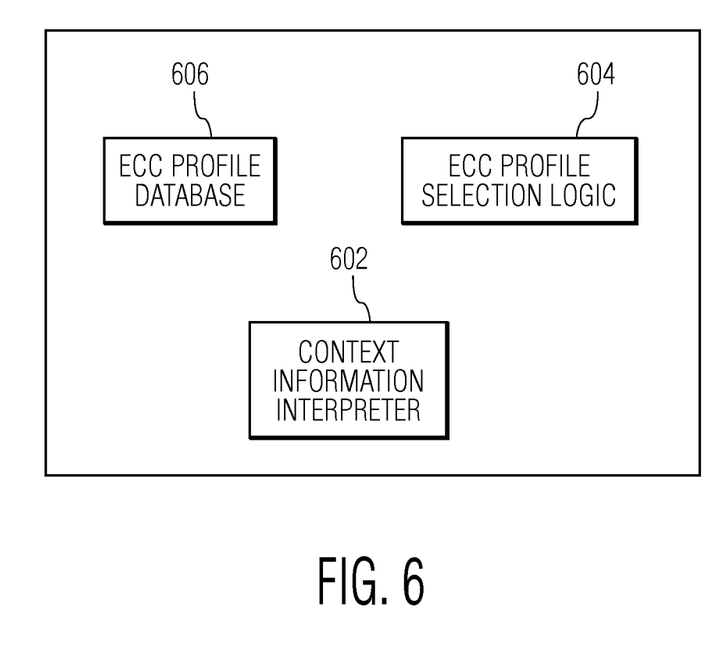
FIG. 6 depicts an embodiment of an ECC profile controller.

FIG. 6 depicts an embodiment of an ECC profile controller. The ECC profile controller includes a context information interpreter 602, ECC profile selection logic 604, and an ECC profile database 606. In an embodiment, the context information interpreter is configured to receive context information from the context source and to process the information using the ECC profile selection logic to select an ECC profile from the ECC profile database that corresponds to the processed context information. In an embodiment, the ECC profile database includes encoding schedules and other configuration settings (e.g., the ECC type and mode of correction) that are output to the central controller for implementation.

Figure 5B:
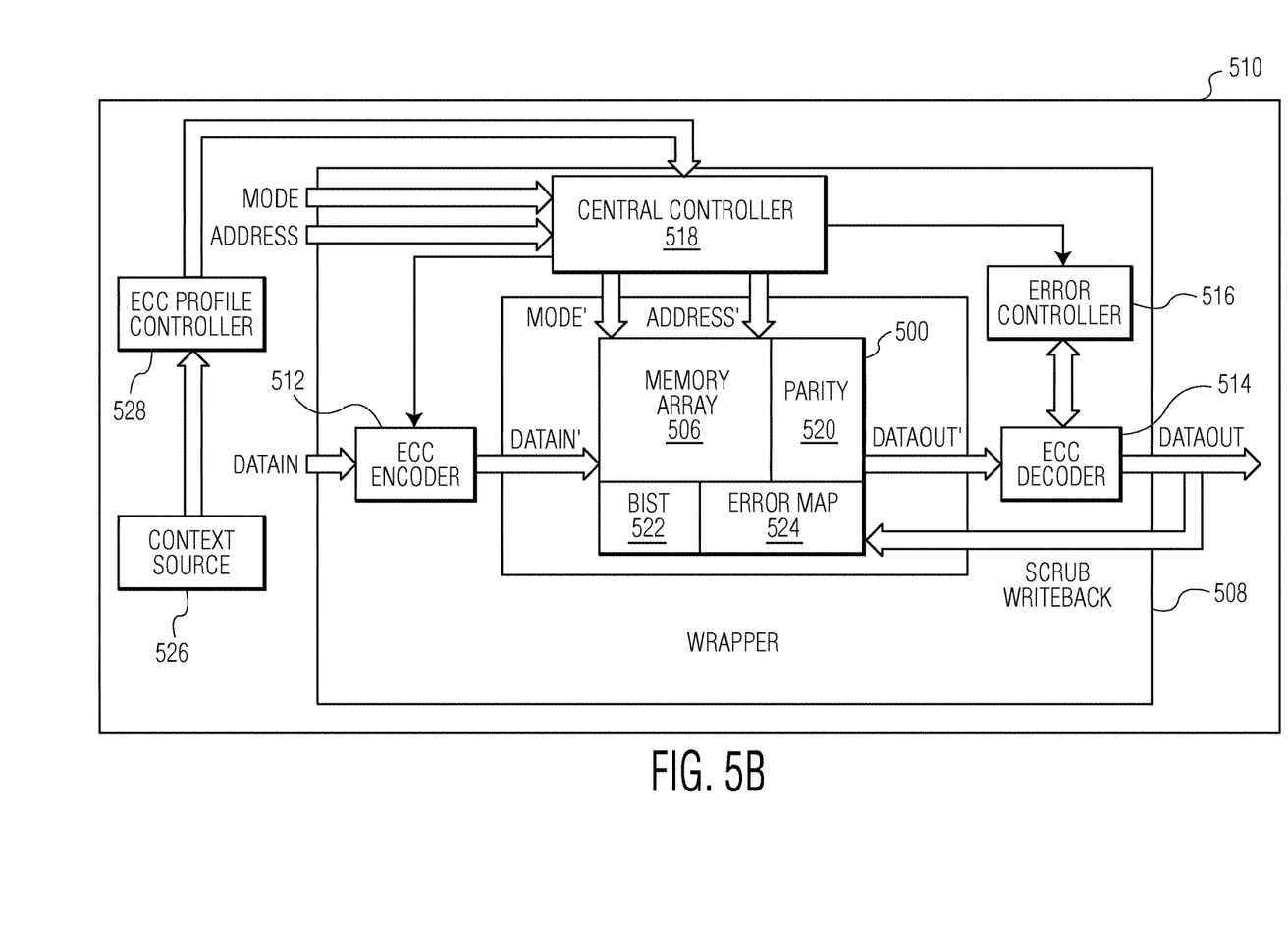
FIG. 5B illustrates the SRAM module and wrapper logic of FIG. 5A in operation.

FIG. 5B illustrates the SRAM module 500 and wrapper logic 508 of FIG. 5A in operation. In an embodiment, the context source 526 outputs context information regarding, for example, the operation of an application utilizing the SRAM module or the state of the IC device 510 (e.g., temperature). In an embodiment, the context source can be a hardware and/or software component configured to output context information for use by the ECC profile controller. Context information may include information such as a process-temperature condition, data retention time, latency and throughput requirements, sensitivity of an application to errors, the availability of space in the SRAM module for parity bits, and the quality of the SRAM module (e.g., how well it is able to store data without corruption). In an embodiment, the context information can be determined by a sensor located within or external to the context source or by system policies manually defined by a user. For example, if the context source is equipped with a temperature sensor, a process sensor, and a voltage supply sensor that indicate that a system associated with the context source can operate at a faster speed, then ECC can be selected to utilize the faster speed. Alternatively, if the context source indicates that a slower speed should be utilized, then ECC may be simplified or bypassed. In an embodiment, the sensors can be implemented via ring-oscillators. In another embodiment, user policies can be implemented either by manual user configuration or by adaptive learning (e.g., audio processes need to run faster so the system learns to bypass ECC for audio processes). The context source passes the context information to the ECC profile controller and, in response to the received context information, the ECC profile controller determines the ECC profile (e.g., the ECC type to use, the ECC encoding schedule, the ECC decoding schedule, and the number of ECC iterations to perform) and passes the determination to the central controller 518 for implementation (e.g., the scheduling of the ECC encoder and ECC decoder). In an embodiment, scheduling of the ECC decoder (as determined by the central controller) and/or ECC encoder further involves an error controller that is configured to provide additional information about the ECC process to the central controller. For example, the error controller can be configured to communicate which bits need correction when ECC is performed. If a particular bit needs to be corrected regularly, the bit maybe parked as faulty to prevent future use of the bit.

Figure 7:
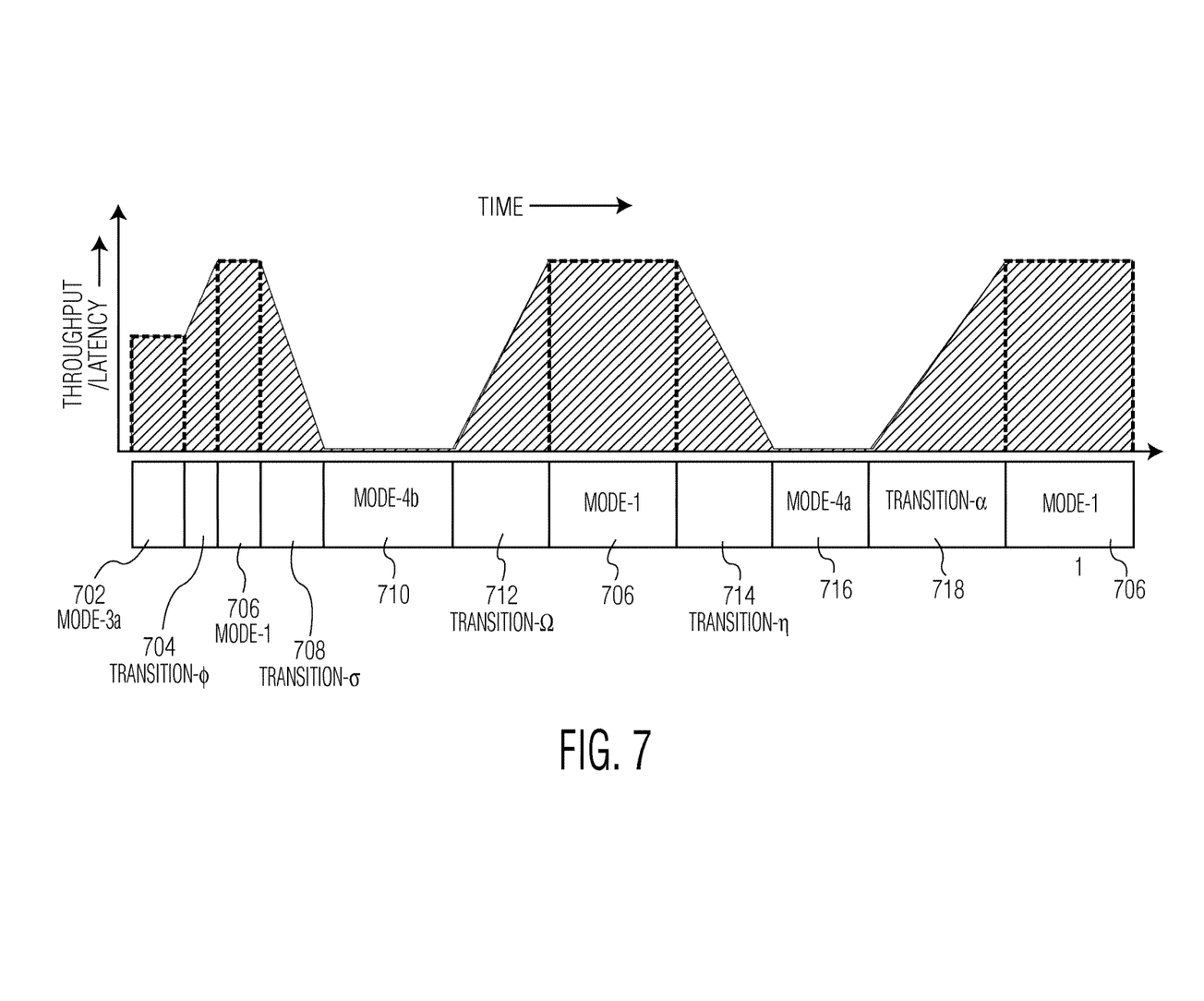
FIG. 7 illustrates an example of the change in performance as the ECC profile is adapted based on context information.

By using an SRAM module and wrapper logic that are configured for context aware ECC adaptation, the impact of error correction (and encoding and decoding data using ECC) on throughput can be reduced. FIG. 7 illustrates an example of scheduling ECC encode and scheduling ECC decoding according ECC profiles selected based on context information. In the example, the system adapts by transitioning among several ECC profiles and scheduling ECC encoding and ECC decoding as needed to implement the transitions. FIG. 7 is labeled with the modes of error correction described above in Table 2 and with transition types, as described in Table 3 below:

TABLE 3

| Transition type | Example Mode change | ECC operation during mode transition | Comment |
|---|---|---|---|
| α | 4a → 1, 2a, 2b | ECC-decoding to overcome errors for very low VDD | Configurable ECC decoding |
| Ω | 4b → 1, 2a, 2b | ECC-decoding to overcome errors for low VDD | during mode transition (Table-1) |
| η | 1 → 4a | ECC-encoding to overcome errors for very low VDD | Configurable ECC encoding |
| σ | 1 → 4b | ECC-encoding to overcome errors for low VDD | during mode transition (Table-1) |
| φ | 4b → 3a or 3a → 4b, 1 | No encoding, decoding during mode transition | No ECC usage during mode transition |

In FIG. 7, the system begins with a first ECC profile corresponding to mode 3a 702 and a simple ECC type (e.g., Hamming or Hsaio) used to encode and decode memory data. According to the first ECC profile, the ECC encoder is scheduled to encode data being written to SRAM module and the ECC decoder is scheduled to decode data being read from the SRAM module. Because a simple ECC type is used, throughput is reduced, but not as significantly as if a more complex ECC type were used. Then, for example, the context source outputs context information that the SRAM module is going to be used by an audio application to store audio data. The audio application prefers high throughput over using a low supply voltage that requires the use of ECC, so the ECC profile controller selects a second ECC profile corresponding to mode 1 706, with no ECC and the central controller initiates transition "φ" 704, causing the system to transition to the second ECC profile, in which the wrapper logic is bypassed. When ECC encoding is suspended, in accordance with the second ECC profile, high throughput can be achieved. In an embodiment, transition "φ" is a quick transition in which scheduling of ECC encoding and ECC decoding disables ECC encoding and ECC decoding and, thus, the transition is simply a matter of disabling the ECC encoder and the ECC decoder (e.g., bypassing the wrapper). Next, the context source outputs context information that the SRAM module is going to be used to store control signal data and will enter standby mode. In standby mode, dataflow is paused (so throughput is irrelevant) and a low supply voltage is used, which makes bit errors more likely to occur. Accordingly, data should be ECC encoded before entering standby mode and the supply voltage is lowered. In response to the context information, the ECC profile controller selects a third ECC profile corresponding to mode 4b 710 (a mode with low supply voltage in which the ECC encoder and ECC decoder are disabled) and the central controller initiates transition "σ" 708, causing the system to transition to the third ECC profile. In an embodiment, transition "σ" is a slow transition because ECC encoding should be scheduled to be applied to data stored in the SRAM module, but the trade-off of being able to use a low supply voltage is worth the slow transition. In mode 4b, a low supply voltage is applied to retain data in the SRAM module, but no ECC encoding or decoding is performed. In an embodiment, mode 4b is utilized in situations where the context source outputs context information that indicates good process conditions (e.g., low radiation levels or constant temperatures) or when data with low error sensitivity is being stored in the SRAM module. Next, the context source outputs context information indicating that the SRAM module is going to be used by an audio application to store audio data and so, again, the ECC profile controller selects the second ECC profile that corresponds to mode 1 with no ECC and initiates transition "Ω" 712, causing the system to transition to the second ECC profile. In an embodiment, transition "Ω" is also a slow transition because ECC decoding must be scheduled to be performed on data stored in the SRAM module to correct errors that may have occurred while the SRAM module was in standby mode. Next, the context source outputs information indicating that an application with low error sensitivity is going to use the SRAM module to store data. In an embodiment, a very low supply voltage can be used with applications that have low error sensitivity because if errors occur in the data, the occurrence will have minimal impact on the operation of the application. Thus, the ECC profile controller selects a fourth ECC profile corresponding to mode 4a 716 in which a low supply voltage is used and the wrapper logic is bypassed and the central controller initiates transition "η" 714, causing the system to transition to the fourth ECC profile. In an embodiment, transition "η" is a slow transition (due to ECC encoding that must be scheduled similarly to transition "σ"). In mode 4a, a very low supply voltage (e.g., a supply voltage lower than the supply voltage applied in mode 4b) is applied to retain data in the SRAM module. Finally, the context source outputs information that indicates an application is going to be using the SRAM module to store audio data and, again, the ECC profile controller selects the second ECC profile and the central controller initiates transition "α" 718, causing the system to return to the second ECC profile, which corresponds to mode 1 with no ECC. In an embodiment, transition "α" is a slow transition similar to transition "Ω" because ECC decoding must be scheduled to correct errors that may have occurred while the SRAM module was in mode 4a.

Figure 8:
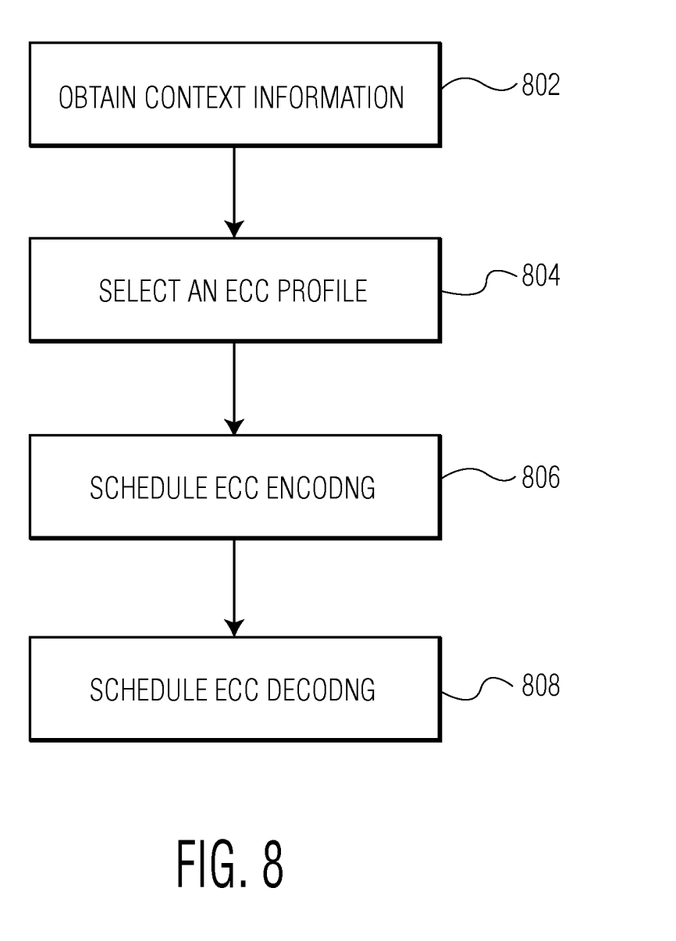
FIG. 8 is a process flow diagram of a method for applying error correction to SRAM memory in an IC device in accordance with an embodiment of the invention.

FIG. 8 is a process flow diagram of a method for applying error correction to SRAM memory in an IC device in accordance with an embodiment of the invention. At block 802, context information is obtained. In an embodiment, obtaining context information involves processing information regarding, for example, the operation of an application utilizing the SRAM module (e.g., the application is an audio application utilizing the SRAM module to store audio data) or the state of an IC device (e.g., the temperature of the IC device) and outputting the result from a context source to an ECC profile controller. In an embodiment, the context information can be detected by the context source via, for example, a temperature sensor or radiation sensor or the context information can be provided by a user (e.g., user determined time over which data must be retained in the SRAM module or throughput requirement). At block 804, an ECC profile is selected. In an embodiment, the ECC profile is selected by the ECC profile controller based on the context information transmitted from the context source to the ECC profile controller. For example, if the context information indicates that an audio application is going to use the SRAM module, then a profile with high throughput may be selected. At block 806, ECC encoding is scheduled. In an embodiment, the ECC profile controller determines the scheduling for the ECC encoding based on the context information received and the central controller implements the scheduling. For example, if the application is an audio application utilizing the SRAM module to store audio data, the ECC profile controller will schedule the ECC encoder not perform ECC encoding (e.g., disable ECC encoding) in order to keep throughput high as needed by the audio application so the central controller will disable the wrapper logic and allow data to pass through the wrapper logic (e.g., without performing manipulations or otherwise modifying the data). At block 808, ECC decoding is scheduled. In an embodiment, the ECC profile controller determines the scheduling for the ECC decoding based on the context information received and the central controller implements the scheduling. For example, if the ECC profile selected by the ECC profile controller determines that ECC decoding should be performed, then a central controller will implement ECC decoding when the data is read from the SRAM module.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An integrated circuit (IC) device comprising:
   an SRAM module;
   wrapper logic coupled to the SRAM module;
   a context source; and
   an ECC profile controller coupled to the context source and to the wrapper logic, the ECC profile controller comprising an ECC profile database and ECC profile selection logic configured to select an ECC profile from the ECC profile database in real-time during operation of the IC device in response to context information received from the context source for use by the wrapper logic;
   wherein the context source is configured to determine a level of error sensitivity based on the level of error sensitivity of an application running on the IC device and the ECC profile selection logic of the ECC profile controller is configured to select the ECC profile from the ECC profile database with a specific supply voltage for the SRAM module and a specific ECC complexity in response to the determined level of error sensitivity and a throughput requirement of the application, and wherein the level of error sensitivity of the application running on the IC device indicates the impact an error in the data of the application will have on the operation of the application.

2. The IC device of claim 1, wherein the context source is configured to detect a process-temperature condition and the ECC profile controller is configured to select the ECC profile in response to the detected process-temperature condition.

3. The IC device of claim 1, wherein the context source is configured to detect a data retention time and the ECC profile controller is configured to select the ECC profile in response to the detected data retention time.

4. The IC device of claim 1, wherein the context source is configured to determine latency and throughput requirements and the ECC profile controller is configured to select the ECC profile in response to the determined latency and throughput requirements.

5. The IC device of claim 1, wherein output of the context source is manually configured by a user.

6. The IC device of claim 1 further comprising an ECC decoder coupled to the SRAM module, wherein the ECC decoder is further coupled to an error map in the SRAM module and the ECC decoder can write back decoding information to the error map.

7. The IC device of claim 1, wherein the SRAM module is coupled to the wrapper logic such that the SRAM module can selectively bypass the wrapper logic from a dataflow.

8. The IC device of claim 1, wherein the wrapper logic is coupled to the SRAM module such that the SRAM module can operate independent of the wrapper logic.

9. A method for applying error correction to SRAM memory in an IC device, the method comprising:
obtaining context information using a context source;
at an ECC profile controller within the IC device, receiving the context information and selecting an ECC profile from an ECC profile database in the ECC profile controller in real-time during operation of the IC device based on the context information;
scheduling ECC encoding according to the selected ECC profile using the ECC profile controller; and
scheduling ECC decoding according to the selected ECC profile using the ECC profile controller;
wherein the context information includes information regarding the sensitivity of the application to errors and the ECC profile controller is configured to select an ECC profile from the ECC profile database with a specific supply voltage for the SRAM memory and a specific ECC complexity based on the sensitivity of the application to errors and a throughput requirement of the application, and wherein the level of error sensitivity of the application running on the IC device indicates the impact an error in the data of the application will have on the operation of the application.

10. The method of claim 9, wherein the context information includes a process-temperature and the ECC profile is selected based on the process-temperature.

11. The method of claim 9, wherein the context information includes retention time of data within the SRAM module and the ECC profile is selected based on the retention time of data within the SRAM module.

12. The method of claim 9, wherein the context information includes latency and throughput requirements of the application and the ECC profile is selected based on the latency and throughput requirements of the application.

13. The method of claim 9, wherein the context information includes a number of allowed parity bits and an ECC algorithm to use and the ECC profile is selected based on the number of allowed parity bits and the ECC algorithm to use.

14. The method of claim 9, wherein the context information is received from a context source within the IC device.

15. An integrated circuit (IC) device comprising:
an SRAM module, the SRAM module including at least one transistor;
wrapper logic coupled to the SRAM module, the wrapper logic comprising:
an error correction code (ECC) encoder coupled to the SRAM module, wherein the ECC encoder is configured to:
encode input data in accordance with an ECC type given a selected mode of error correction; and
output the encoded input data to the SRAM module;
an ECC decoder coupled to the SRAM module, wherein the ECC decoder is configured to:
decode output data received from the SRAM module;
output the decoded output data; and
write decoding information back to the SRAM module;
an error controller coupled to the ECC decoder that is configured to control the ECC decoder in accordance with the ECC type given a selected mode of error correction; and
a central controller coupled to the error controller and the ECC encoder, wherein the central controller is configured to control operations between elements of the wrapper and the SRAM module;
a context source configured to output context information; and
an ECC profile controller coupled between the wrapper logic and the context source, the ECC profile controller comprising an ECC profile database and ECC profile selection logic configured to select an ECC profile from the ECC profile database in real-time during operation of the IC device to be used by the ECC encoder and decoder based on the context information from the context source;
wherein the context source is configured to determine a level of error sensitivity based on the level of error sensitivity of an application running on the IC device and the ECC profile selection logic of the ECC profile controller is configured to select the ECC profile from the ECC profile database with a specific supply voltage for the SRAM module and a specific ECC complexity in response to the determined level of error sensitivity and a throughput requirement of the application, and wherein the level of error sensitivity of the application running on the IC device indicates the impact an error in the data of the application will have on the operation of the application.

16. The IC device of claim 15, wherein the context source is configured to detect at least one of a process-temperature condition, a data retention time, and latency and throughput requirements of an application running on the IC device.

17. The IC device of claim 15, wherein the ECC decoder is further coupled to an error map in the SRAM module and the ECC decoder can write back decoding information to the error map.

18. The IC device of claim 15, wherein the ECC encoder is further coupled to parity cells in the SRAM module in which the ECC encoder can store error correction codes corresponding to memory words of the input data.

* * * * *